United States Patent
Satoh

[11] Patent Number: 6,070,088
[45] Date of Patent: May 30, 2000

[54] MOBILE TELEPHONE SET WITH AUTOMATIC SOUND LEVEL CONTROL

[75] Inventor: Kazuhisa Satoh, Saitama, Japan

[73] Assignee: NEC Corporation, Tokyo, Japan

[21] Appl. No.: 08/863,538

[22] Filed: May 27, 1997

[30] Foreign Application Priority Data

May 28, 1996 [JP] Japan ................................. 8-133710

[51] Int. Cl.[7] .............................. H01S 4/00; H04L 27/04
[52] U.S. Cl. ...................... 455/550; 455/572; 455/575; 375/312
[58] Field of Search .................... 455/570, 575, 455/572, 550, 116, 127; 375/312

[56] References Cited

U.S. PATENT DOCUMENTS

| | | | |
|---|---|---|---|
| 3,808,540 | 4/1974 | Kabrick | 325/187 |
| 5,390,244 | 2/1995 | Hinman et al. | |
| 5,404,315 | 4/1995 | Nakano et al. | |
| 5,471,527 | 11/1995 | Ho et al. | |
| 5,526,407 | 6/1996 | Russell et al. | 379/89 |
| 5,602,913 | 2/1997 | Lee et al. | 379/406 |
| 5,734,987 | 3/1998 | Shiono et al. | 455/570 |
| 5,812,944 | 9/1998 | Matsumoto | 455/403 |

FOREIGN PATENT DOCUMENTS

| | | | |
|---|---|---|---|
| 0 489 645 | 6/1992 | European Pat. Off. | |
| 62-278858 | 12/1987 | Japan | 379/167 |
| 3-208442 | 9/1991 | Japan | |
| 5-204395 | 8/1993 | Japan | |

*Primary Examiner*—Wellington Chin
*Assistant Examiner*—Sheila B. Smith
*Attorney, Agent, or Firm*—Young & Thompson

[57] ABSTRACT

In a portable telephone set having an audio-frequency amplifier (12) for amplifying a sound signal from a microphone (11) and a codec (13),for digitizing and coding the sound signal into a digital sound signal which is transmitted therefrom, a level of said sound signal is monitored (17) to produce a detected level and is averaged at a timing (18) and compared with level data stored in a memory (15), and an amplification control signal is produced. At least one of the audio-amplifier (12) and said codec (13) is controlled its amplification degree in response to the amplification control signal.

6 Claims, 2 Drawing Sheets

MOBILE TELEPHONE SET WITH
AUTOMATIC SOUND LEVEL CONTROL

BACKGROUND OF THE INVENTION

The present invention relates to a mobile or portable telephone set and, In particular, to level control of a sound signal in such a portable telephone set.

In the known portable telephone set or a mobile telephone set such as terminals in the Cellular Communication system, the Personal Handy-phone System and other wireless communication system, a sound signal inputted by a microphone is amplified by an audio-frequency amplifier. The amplified sound signal is digitized and coded by a codec into a digital sound signal which is carried on a carrier frequency signal and is transmitted as a wireless signal.

The sound signal has different sound levels dependent on sound pressure of the utterance to the microphone. In the known portable telephone set, the sound level of the sound signal is not adjusted before transmitting therefrom. At receiving party, the sound level is only adjusted by a volume of sound.

However, when the sound pressure of the utterance is excessively high, distortion is caused at the audio-amplifier and/or an overflow is caused at an analog/digital converter in the codec. As a result, sound is distorted at the receiver side.

On the contrary, when the sound pressure is weak, the volume adjustment must be performed at the receiver side.

SUMMARY OF THE INVENTION:

Therefore, it is an object of the present invention to provide a portable telephone set which can automatically control the level of the sound signal to transmit a sound signal with a constant level without relation to sound pressure of utterance to the microphone.

According to the present invention, there is provided a portable telephone set comprising an audio-frequency amplifier for amplifying a sound signal from a microphone, a codec for digitizing and coding the sound signal into a digital sound signal, a digital signal processor for monitoring a level of the sound signal to produce a detected level, a memory for storing level data, and sound level controlling means for collating the level data stored in the memory with the detected level to control amplification degree of at least one of the audio-amplifier and the codec.

The sound level controlling means preferably comprises: timer means for producing a timing signal at a predetermined time interval; a processor unit for storing the detected level into the memory, the processor unit responsive to the timing signal averaging the detected level stored in the memory to produce an averaged level and comparing the averaged level with the level data to produce an error level, the processor unit producing an amplification control signal corresponding to the error level; gain control means responsive to the amplification control signal for controlling the amplification degree of at least one of the audio-amplifier and the codes.

The codec usually comprises a prefilter for passing the sound signal from the audio-frequency amplifier, an analog/digital converter for digitizing the sound signal into the digital signal, a digital gain controller for performing a gain control of the digital sound signal, and a bandpass filter for passing the digital sound signal. The prefilter is controlled by the gain controller to perform controlling the amplification degree of the codec.

Alternatively, the digital gain controller is controlled by the gain controller to perform controlling the applification degree of the codec.

DESCRIPTION OF PREFERRED EMBODIMENTS

Prior to description of preferred embodiments of this invention, a known portable or mobile telephone set in the prior art will be described in connection with processing an audio or sound signal outgoing therefrom, with reference to FIG. 1.

Figure 1:
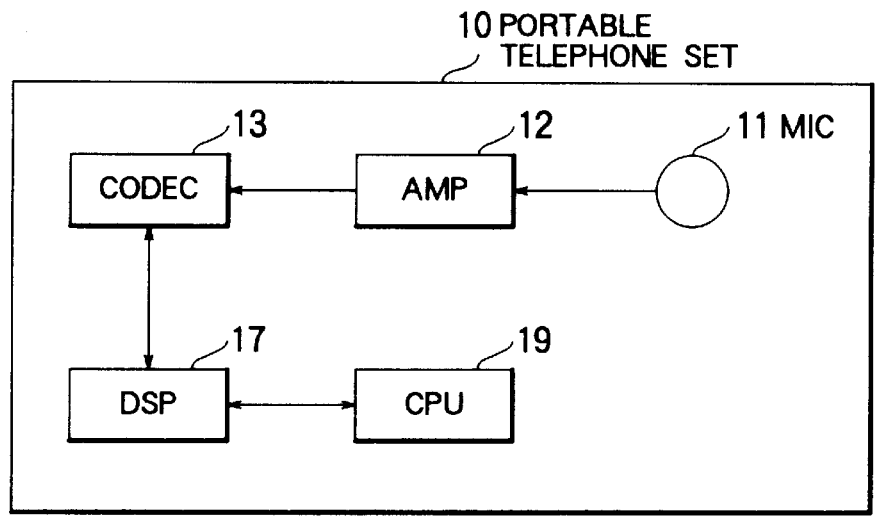
FIG. 1 is a block diagram of a known portable telephone set.

Referring to FIG. 1, the known portable telephone set 10 includes a microphone (MIC) 11 for converting speech into an analog sound or audio signal, a low-frequency amplifier (AMP) 12 for amplifying the sound signal to produce an amplified sound signal, a codec section (CODEC) 13 for digitizing and coding the amplified sound signal from the amplifier 12 to produce a digital sound signal which is carried on a wireless carrier frequency signal and is transmitted therefrom On the other hand, a digital signal processor (DSP) 17 processes the sound signal coded at the codec 13 under control of a central processing unit (CPU) 19.

In the known portable telephone set, an amplification degree of the amplifier 12 and an amplification degree of the codec 13 are set to fixed values, respectively, during communication. Therefore, The Sound signal has a sound level which is corresponding to a sound pressure uttered towards the microphone 11. Accordingly, an adjustment of the sound level has been performed by adjusting a volume to an adequate level at the other telephone set of the receiving party.

Now, embodiments of the present invention will be described with reference to the drawings.

Figure 2:
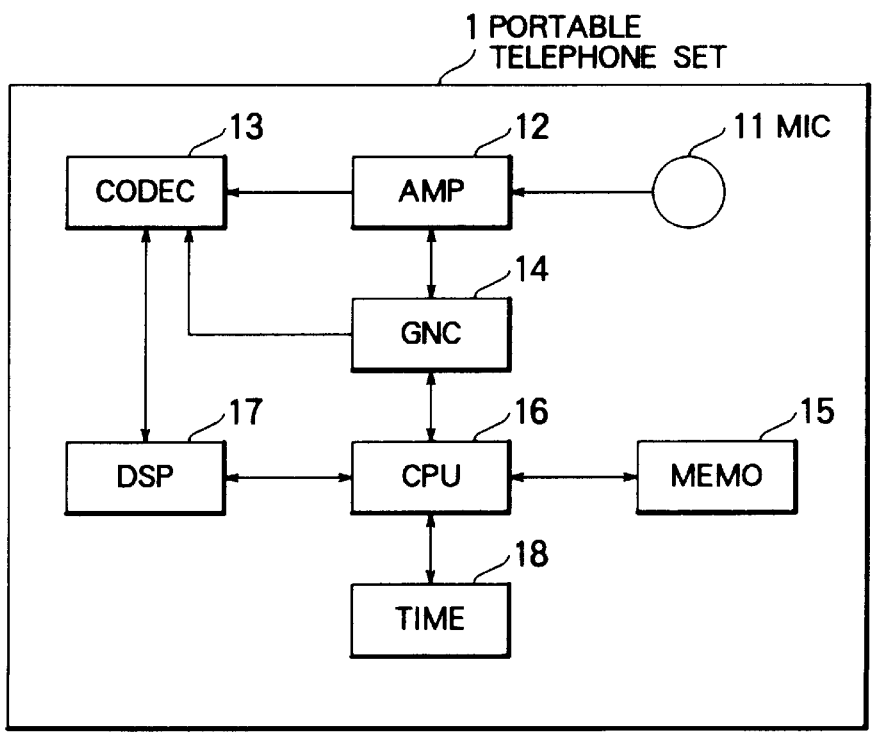
FIG. 2 is a block diagram of a portable telephone set according to an embodiment of the present invention.

Referring to FIG. 2, a portable telephone set 1 according to an embodiment shown therein also includes a microphone (MIC) 11 for converting speech into an analog sound or audio signal, a low-frequency amplifier (AMP) 12 for amplifying the sound signal to produce an amplified sound signal, a codec section (CODEC) 13 for digitizing and coding the amplified sound signal from the amplifier 12 to produce a digital sound signal which is carried on a wireless carrier frequency signal and is transmitted therefrom, a digital signal processor (DSP) 17 for monitoring codec 13 to detect a sound level, and a memory (MEMO) IS for storing level data that will be used to control the level of the sound signal to be transmitted.

The portable telephone set 1 further comprises a level controller for collating the level data previously stored in the memory 15 with the detected level to control the amplification degree of at least one of the audio-amplifier 12 and the codec 13.

The level controller comprises a central processing unit (CPU) 16 that receives the detected level from the DSP 17 and stores the detected level into the memory 15. The central processing unit 16 averages the detected level signal stored in the memory 15 in response to a timing signal to produce an averaged level. Then, the central processing unit 16 compares the averaged level and the level data previously stored in the memory 15 to produce an error signal, and produce an amplification control signal.

The portable telephone set 1 further comprises a timer (TIME) 18 for producing the timing signal to deliver the timing signal to the central processing unit 16, and a gain controller (GNC) 14 for controlling the amplification degrees of the amplifier 12 and the codec 13 in response to the amplification control signal.

In operation, the sound signal inputted from the microphone 11 is amplified at the amplifier 12 and inputted into the codec 13. The amplified signal from the amplifier 12 is digitized and coded into a digital sound signal at the codec 13.

The digital signal processor 17 monitors the digital sound signal to detect a sound level of the sound signal. The detected level is provided the central processing unit 16

The central processing unit 16 stores the detected levels from the digital signal processor 17 into the memory 15, averages them at a given timing based on the timing signal from the timer 18 to produce an averaged level. The central processing unit 16 further compares the averaged level with the level data preset in the memory 15 and instructs the gain controller 14 by the gain control signal to change the amplification degree of the amplifier 12 and the codec 13. Thus, the amplification degree of the amplifier 12 and the codec 13a are controlled to thereby change the level of the sound signal transmitted to an adequate sound level.

The timer 18 is preset to produce the timing signal, and the preset time interval is also stored in the memory 15.

Figure 3:
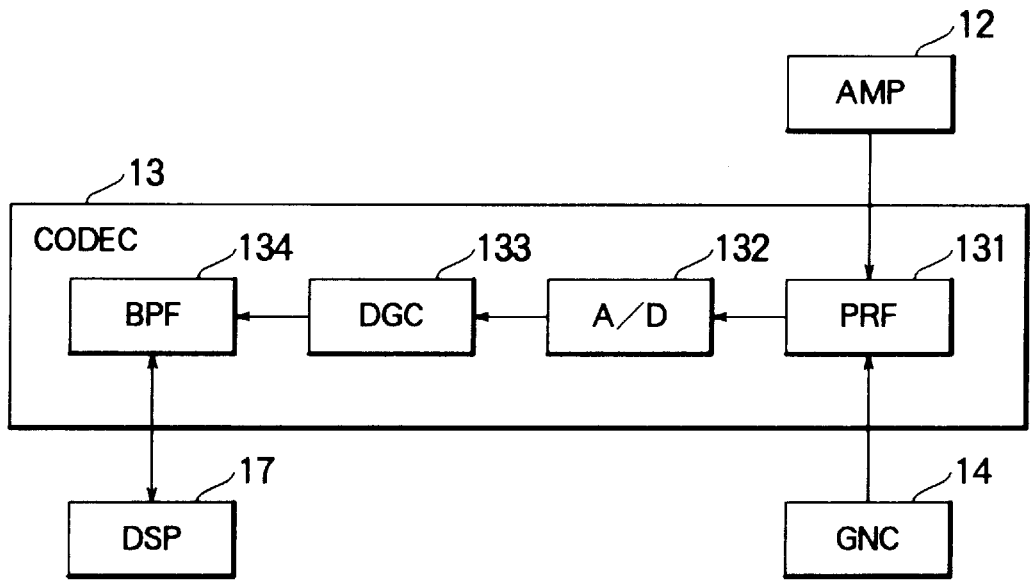
FIG. 3 is a block diagram of a codec which is controlled by a gain controller.

Referring to FIG. 3, the codes 13 comprises a prefilter (PRF) of a gain controllable type 131 for passing the sound signal from the amplifier 12, an analog/digital converter (A/D) 132 for digitizing the sound signal to a digital sound signal, a digital gain controller (DGC) 133 for controlling a gain of the digital sound signal, and a bandpass filter (BPF) 134 for passing the digital sound signal.

When controlling the amplification degree of the codec 13 according to the instruction by the amplification control signal from the central processing unit 16, the gain controller 14 controls the prefilter 131. That is, gain controller 14 controls the gain of the prefilter 131 or the attenuation level over the frequency pass band of the prefilter 131.

Figure 4:
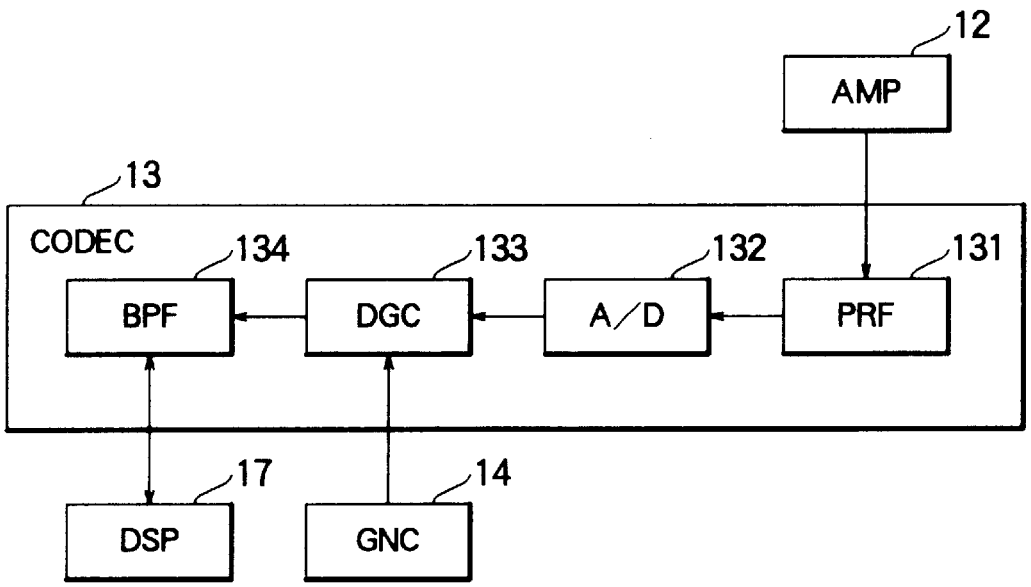
FIG. 4 is another block diagram of the codec which is controlled by the gain controller in another fashion.

Alternatively, the gain controller 14 the controls the digital gain controller 133, as shown in FIG. 4. That is, the control gain in the digital gain controller 133 is changed by the gain controller 14.

In the embodiment described above, the gain controller 14 controls the amplification degree of the amplifier 12 or the codec 13 individually. However, it can be easily done to control both the amplifier 12 and the codec 13 in a combined fashion.

What is claimed is;:

1. A portable telephone set comprising:
    an audio-frequency amplifier amplifying sound signals from a microphone;
    a codec digitizing and coding said sound signals into digital sound signals;
    a digital signal processor monitoring levels of said sound signal to produce detected levels;
    a memory storing preset sound level data; and
    sound level controlling means for averaging the detected levels and comparing the average to said preset sound level data stored in said memory to control amplification of at least one of said audio-amplifier and said codec,
    wherein said sound level controlling means comprises,
    timer means for producing a timing signal at a predetermined time interval,
    a processor unit storing said detected levels into said memory, said processor unit being responsive to said timing signal to average said detected levels stored in said memory to produce an averaged level and comparing said averaged level with said preset sound level data to produce an error level, said processor unit producing an amplification control signal corresponding to said error level, and
    gain control means responsive to said amplification control signal for controlling said amplification degree of at least one of said audio-amplifier and said codec, and
    wherein said codec comprises,
    a prefilter for passing said sound signals from said audio-frequency amplifier,
    an analog/digital converter for digitizing said sound signals into said digital signals,
    a digital gain controller for controlling a gain of said digital sound signals, and
    a bandpass filter for passing said digital sound signals.

2. A portable telephone set as claimed in claim 1, wherein said prefilter is controlled by said gain controller to control amplification by said codec.

3. A portable telephone set as claimed in claim 1, wherein said digital gain controller is controlled by said gain controller to control amplification by said codec.

4. A telephone comprising:
    an amplifier for amplifying sound signals from a microphone;
    a codec for digitizing the amplified sound signals from said amplifier, said codec comprising a prefilter receiving the amplified sound signals from said amplifier, an analog-to-digital converter digitizing the received sound signals, a digital gain controller adjusting a gain of the digitized sound signals, and a bandpass filter passing the gain-adjusted digitized sound signals;
    a digital signal processor connected to said codec and indicating sound levels of the signals from said codec;
    a memory storing a preset sound level;
    a timer;
    a processor unit connected to said timer, said memory, and said digital signal processor averaging the indicated sound levels at a time interval from said timer and comparing the average to the preset sound level to provide an error signal; and
    gain control means connected to said processing unit and to at least one of said codec and said amplifier for adjusting a gain of the sound signals from said one of said codec and said amplifier based on the error signal.

5. The telephone of claim 4, wherein said gain control means is connected to said prefilter in said codec, and said prefilter controls the sound level from said codec.

6. The telephone of claim 4, wherein said gain control means is connected to said digital gain controller in said codec, and said digital gain controller controls the sound level from said codec.

* * * * *